(12) United States Patent
Kim et al.

(10) Patent No.: US 12,217,970 B2
(45) Date of Patent: Feb. 4, 2025

(54) PLASMA ETCHING METHOD USING PERFLUOROPROPYL CARBINOL

(71) Applicant: AJOU UNIVERSITY INDUSTRY-ACADEMIC COOPERATION FOUNDATION, Suwon-si (KR)

(72) Inventors: Chang-Koo Kim, Seoul (KR); Jun-Hyun Kim, Seongnam-si (KR)

(73) Assignee: AJOU UNIVERSITY INDUSTRY-ACADEMIC COOPERATION FOUNDATION, Suwon-si (KR)

( * ) Notice: Subject to any disclaimer, the term of this patent is extended or adjusted under 35 U.S.C. 154(b) by 294 days.

(21) Appl. No.: 17/923,495

(22) PCT Filed: Mar. 2, 2021

(86) PCT No.: PCT/KR2021/002532
§ 371 (c)(1),
(2) Date: Nov. 4, 2022

(87) PCT Pub. No.: WO2021/225264
PCT Pub. Date: Nov. 11, 2021

(65) Prior Publication Data
US 2023/0197466 A1    Jun. 22, 2023

(30) Foreign Application Priority Data
May 7, 2020    (KR) .................. 10-2020-0054572

(51) Int. Cl.
*H01L 21/311* (2006.01)
*H01J 37/32* (2006.01)
*H01L 21/02* (2006.01)

(52) U.S. Cl.
CPC .. *H01L 21/31116* (2013.01); *H01J 37/32449* (2013.01); *H01L 21/02164* (2013.01); *H01L 21/31144* (2013.01); *H01J 2237/3341* (2013.01)

(58) Field of Classification Search
None
See application file for complete search history.

(56) References Cited

U.S. PATENT DOCUMENTS 4,938,995 A * 7/1990 Giordano ................. B05D 1/62
427/490
7,449,415 B2 * 11/2008 Hirayama ............. C07C 17/208
257/E21.252

(Continued)

FOREIGN PATENT DOCUMENTS

KR    10-2001-0003256 A    1/2001
KR    10-2020-0018897 A    2/2020

OTHER PUBLICATIONS

International Search Report for PCT/KR2021/002532 dated, Jun. 7, 2021 (PCT/ISA/210).

*Primary Examiner* — Allan W. Olsen
(74) *Attorney, Agent, or Firm* — Sughrue Mion, PLLC

(57) ABSTRACT

Disclosed is a plasma etching method. The plasma etching method comprises: a first step for evaporating liquid perfluoropropyl carbinol (PPC); a second step for supplying a discharge gas including the evaporated PPC and argon gas to a plasma chamber in which an object to be etched is arranged; and a third step for discharging the discharge gas to generate plasma, and using the plasma to plasma-etch the object to be etched.

11 Claims, 8 Drawing Sheets

(56) References Cited

U.S. PATENT DOCUMENTS

| | | |
|---|---|---|
| 11,566,177 B2 * | 1/2023 | Oomori ............... H01L 21/3065 |
| 2003/0000913 A1 | 1/2003 | Hung et al. |
| 2005/0014383 A1 | 1/2005 | Ji et al. |
| 2007/0187362 A1 * | 8/2007 | Nakagawa ................. C23F 4/00 |
| | | 216/81 |
| 2017/0103901 A1 | 4/2017 | Shen et al. |
| 2020/0035502 A1 * | 1/2020 | Kim .................. H01L 21/31116 |
| 2020/0048550 A1 * | 2/2020 | Kim .................. H01L 21/31116 |
| 2022/0246439 A1 * | 8/2022 | Kim .................. H01L 21/02126 |
| 2022/0363989 A1 * | 11/2022 | Kim ....................... C09K 13/00 |
| 2023/0162972 A1 * | 5/2023 | Kim .................. H01L 21/02164 |
| | | 438/706 |
| 2023/0178341 A1 * | 6/2023 | Kim .................. H01J 37/32449 |
| | | 438/723 |
| 2024/0006186 A1 * | 1/2024 | Kim .................. H01L 21/31116 |

* cited by examiner 200 nm hole pattern

PLASMA ETCHING METHOD USING PERFLUOROPROPYL CARBINOL

FIELD

The present disclosure relates to a plasma etching method using perfluoropropyl carbinol (PPC) with a low global warming potential as a discharge gas.

DESCRIPTION OF RELATED ART

Demand for a structure having a high aspect ratio is increasing due to high density of an integrated circuit and miniaturization of an element in a semiconductor device. In general, the high aspect ratio structure is fabricated in an insulating layer for electrically separating the structure from a conductive layer. In order to manufacture such a high aspect ratio structure, a scheme of plasma etching silicon oxide ($SiO_2$) is widely used. Currently, in the plasma etching process of silicon oxide, perfluorocarbon (PFC) gas such as $CF_4$, $C_2F_6$, $C_3F_6$, $C_3F_8$, and $C_4F_8$ is mainly used. The PFC gas generates various active species under plasma. In this regard, using $CF_x$ active species, a fluorocarbon thin film as a carbon-based polymer is deposited on a substrate surface, thereby protecting a mask, and serving as a source of an etching agent to improve a selectivity with respect to the mask.

However, the fluorocarbon thin film deposited during the plasma etching may interfere with diffusion of reactive ions and radicals depending on a thickness thereof, thereby lowering an etch rate. Further, excessive deposition of the fluorocarbon thin film on a wall face of an etched structure may cause etching stop, such that a target etched depth is not achieved, and, further, a diameter of a bottom of the etched structure is smaller than a diameter of the mask.

Further, PFC is one of 6 major greenhouse gases ($CO_2$, $CH_4$, $N_2O$, HFC, PFC, $SF_6$). The PFC gas is chemically stable and has a long average residence time in the atmosphere and thus a high global warming potential (GWP) value which is higher, by 6500 times or greater, than GWP of $CO_2$. Thus, the small amount of the PFC gas may greatly contribute to the global warming effect. In addition, as a proportion of the etching process in a semiconductor device manufacturing process increases, an annual discharge amount of the PFC gas is continuously increasing. Thus, in order to reduce the emission of PFC gas, various methods such as PFC gas decomposition, separation and collection have been employed. However, those methods have fundamental limits due to the PFC gas having the high GWP.

Therefore, there are a need for a novel etchant which may replace the conventional PFC gas, have a low GWP and thus are environmentally friendly, have an excellent etching characteristic to allow a high aspect ratio etched structure to be formed, and a need for a plasma etching method using the novel etchant.

DISCLOSURE

Technical Purposes

One purpose of the present disclosure is to provide a plasma etching method using perfluoropropyl carbinol (PPC) having a low global warming potential as a discharge gas in place of the conventional PFC gas having a high global warming potential.

Technical Solutions

One aspect of the present disclosure provides a plasma etching method comprising: a first step of vaporizing liquid perfluoropropyl carbinol (PPC); a second step of supplying a discharge gas containing the vaporized perfluoropropyl carbinol (PPC) and argon gas to a plasma chamber in which an etching target is disposed; and a third step of discharging the discharge gas to generate plasma and of performing plasma etching on the etching target using the generated plasma.

In one implementation, in order to vaporize the liquid perfluoropropyl carbinol (PPC) and then supply the vaporized perfluoropropyl carbinol (PPC) to the etching chamber, a first container accommodating the liquid perfluoropropyl carbinol (PPC) therein may be heated to a first temperature equal to or higher than a boiling point of the perfluoropropyl carbinol (PPC), and a connecting pipe connecting the first container to the etching chamber may be heated to a second temperature higher than the first temperature.

In one implementation, the vaporized perfluoropropyl carbinol (PPC) and the argon gas may be supplied to the etching chamber at a flow rate ratio in a range of 2:3 to 1:9.

In one implementation, the vaporized perfluoropropyl carbinol (PPC) and the argon gas may be supplied to the etching chamber at a flow rate ratio in a range of 2:3 to 1:4.

In one implementation, the vaporized perfluoropropyl carbinol (PPC) and the argon gas may be supplied to the etching chamber at a flow rate ratio in a range of 23:67 to 1:4.

In one implementation, the vaporized perfluoropropyl carbinol (PPC) and the argon gas may be supplied to the etching chamber at a flow rate ratio in a range of 3:7 to 1:4.

In one implementation, the discharge gas may further contain oxygen.

In one implementation, the perfluoropropyl carbinol (PPC) gas, the argon gas and the oxygen may be supplied to the etching chamber so that a ratio of a flow rate of the oxygen and a sum of a flow rate of the perfluoropropyl carbinol (PPC) gas and the flow rate of the argon gas is in a range of 1:9 to 1:99.

In one implementation, a bias voltage in a range of −200V to −1400V may be applied to a substrate supporting the etching target thereon in the etching chamber during the third step.

In one implementation, a source power in a range of 200 to 1000 W may be applied to a plasma source coupled to the etching chamber to generate plasma of the discharge gas during the third step.

In one implementation, the etching target may be a silicon oxide thin film.

Technical Effects

According to the present disclosure, the perfluoropropyl carbinol (PPC) gas having a Global Warming Potential (GWP) lower than that of the conventional PFC gas is used as the discharge gas in the etching process, such that the etching process may be more environmentally friendly and the greenhouse gas emission may be reduced. In particular, when the PPC gas is used in a semiconductor manufacturing process, an optimal high aspect ratio etched structure may be achieved.

DETAILED DESCRIPTIONS

Figure 1:
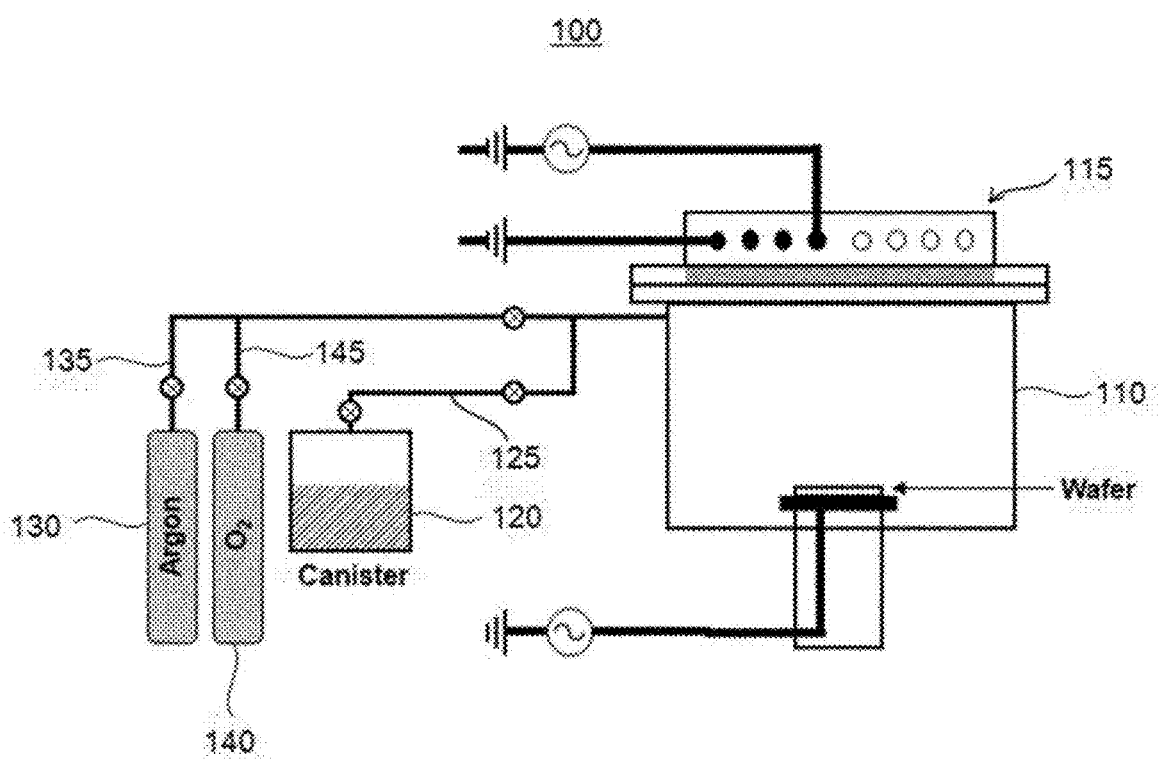
FIG. 1 is a schematic diagram of a plasma etching apparatus capable of performing a plasma etching method according to an embodiment of the present disclosure.

Hereinafter, an embodiment of the present disclosure will be described in detail with reference to the accompanying drawings. The present disclosure may be variously modified and may take many forms. Thus, specific embodiments will be illustrated in the drawings and described in detail herein. However, the specific embodiments are not intended to limit the present disclosure thereto. It should be understood that all changes, equivalents thereto, or substitutes therewith are included in a scope and spirit of the present disclosure. In describing the drawing, similar reference numerals are used for similar components.

The terminology used herein is for the purpose of describing particular embodiments only and is not intended to be limiting of the present disclosure. As used herein, the singular forms "a" and "an" are intended to include the plural forms as well, unless the context clearly indicates otherwise. It will be further understood that the terms "comprises", "comprising", "includes", and "including" when used in this specification, specify the presence of the stated features, integers, operations, elements, and/or components, but do not preclude the presence or addition of one or greater other features, integers, operations, elements, components, and/or portions thereof.

Unless otherwise defined, all terms including technical and scientific terms used herein have the same meaning as commonly understood by one of ordinary skill in the art to which this inventive concept belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic diagram of a plasma etching apparatus capable of performing a plasma etching method according to an embodiment of the present disclosure.

Referring to FIG. 1, the plasma etching method according to an embodiment of the present disclosure may include providing a discharge gas containing perfluoropropyl carbinol (PPC) gas and argon (Ar) gas into a plasma chamber in which an etching target is disposed, such that plasma etching on the etching target is performed.

The etching target is not particularly limited, but may be a silicon oxide layer, a silicon nitride layer, or the like, which generally functions as an insulating layer in a semiconductor device manufacturing process. For example, the etching target may be a silicon oxide layer such as a silicon dioxide ($SiO_2$) layer.

In one embodiment, the discharge gas may further contain oxygen ($O_2$) gas in addition to the perfluoropropyl carbinol (PPC) and the argon.

The PPC is composed of 4 carbons, 3 hydrogens, 1 oxygen, and 7 fluorines, and has a boiling point of about 95° C. and thus may exist in a liquid state at room temperature. Specific physical properties of the PPC used in the present disclosure are shown in Table 1 below.

TABLE 1

| Chemical Structure | |
|---|---|
| Molecular formula | $C_4H_3F_7O$ |
| Molecular Weight (g/mol) | 200 |
| Boiling Point (° C.) | 95 |
| Density (g/mL) | 1.596 @ 20° C. |
| GWP | 16 |

In one embodiment, the plasma etching method according to the embodiment of the present disclosure may be performed using the etching apparatus shown in FIG. 1. In one embodiment, the etching apparatus 100 may include an etching chamber 110, a first container 120, a second container 130 and a third container 140. The etching chamber 110 may be coupled to a plasma source 115 and may have a discharge space accommodating an etching target (wafer) therein. The discharge space may receive the discharge gas from the first to third containers 120, 130, and 140, and the plasma source 115 may apply a discharge voltage to the discharge gas to generate plasma.

The first to third containers 120, 130, and 140 may be connected to the etching chamber 110 via first to third connection pipes 125, 135, and 145, respectively. perfluoropropyl carbinol (PPC) in a liquid state may be accommodated in the first container 120, and argon gas and oxygen gas may be accommodated in the second and third containers 130 and 140, respectively.

The perfluoropropyl carbinol (PPC) accommodated in the first container 120 has a boiling point of 95° C. and thus exists as a liquid at room temperature. Thus, in order that the liquid perfluoropropyl carbinol (PPC) uniformly flows into the etching chamber 110, the perfluoropropyl carbinol (PPC) may be vaporized and then supplied to the discharge space of the etching chamber 110. In one embodiment, the vaporization of the perfluoropropyl carbinol (PPC) may be carried out by heating the first container 120 accommodating the liquid perfluoropropyl carbinol (PPC) therein and the first connection pipe 125 connecting the first container 120 and the etching chamber 110 to each other to a temperature higher than the boiling point of the perfluoropropyl carbinol (PPC). In one example, in one embodiment, in order that variation in a flow rate of the perfluoropropyl carbinol (PPC) being provided to the etching chamber 110 due to droplet splashing is prevented, the first container 120 may be heated to a first temperature higher than the boiling point of the perfluoropropyl carbinol (PPC), while the first connection pipe 125 may be heated to a second temperature higher than the first temperature. For example, the first container 120 may be heated to a temperature of about 90 to 110° C. using a heating jacket, and the first connection pipe 125 may be heated to a temperature of about 145 to 165° C. In one example, a mass flow controller may be installed at an outlet of the first connection pipe 125 such that the vaporized perfluoropropyl carbinol (PPC) flows to the discharge space of the etching chamber 110 at a constant flow rate.

The argon gas accommodated in the second container 130 and the oxygen gas accommodated in the third container 140 may be provided to the discharge space of the etching chamber 110 via the second connection pipe 135 and the third connection pipe 145, respectively different from the first connection pipe 125.

According to the present disclosure, when the Ar gas and the perfluoropropyl carbinol (PPC) gas are fed to the discharge space of the etching chamber 110 and then the plasma is generated, a plasma density may be increased, and anisotropic etching of the etching target may be performed via ion bombardment. Specifically, when electropositive Ar is added to electronegative fluorocarbon plasma, the plasma density may be improved such that decomposition of a precursor such as perfluoropropyl carbinol (PPC) may be increased, thereby greatly affecting a gas phase and a surface chemistry. For example, a representative change in the surface chemistry due to the addition of Ar may be a decrease in a fluorine content of a steady state fluorocarbon formed on a surface. Further, since Ar is electropositive, Ar moves in an accelerated manner toward a negatively charged wafer to conduct ion bombardment thereon. Accordingly, the anisotropic etching may be achieved when a hole is formed in the wafer.

In one embodiment of the present disclosure, when the etching target is made of silicon oxide, the perfluoropropyl carbinol (PPC) gas and the Ar gas may be provided to the discharge space of the etching chamber 110 at a flow rate ratio in a range of about 2:3 (=40:60) to 1:9 (=10:90). When the flow rate ratio of the perfluoropropyl carbinol (PPC) gas and the Ar gas is lower than 2:3 (=40:60), there may be a problem that the etch rate on the etching target is too low. When the flow rate ratio of the perfluoropropyl carbinol (PPC) gas and the Ar gas exceeds 1:9 (=10:90), there is a problem in that the etch rate is significantly lowered due to a decrease in an amount of an etchant capable of etching the etching target. For example, when the etching target is made of silicon oxide, the perfluoropropyl carbinol (PPC) gas and the Ar gas may be provided to the discharge space of the etching chamber 110 at a flow rate ratio in a range of about 2:3 (=40:60) to 1:4 (=20:80), about 23:67 to 1:4 (=20:80) or about 3:7 (=30:70) to 1:4 (=20:80).

In one embodiment, when the discharge gas further includes oxygen ($O_2$) gas in addition to the perfluoropropyl carbinol (PPC) and the argon, the oxygen gas may appropriately control a thickness of the fluorocarbon thin film generated by the plasma etching to improve etching efficiency. For example, adding the oxygen ($O_2$) gas thereto may allow an excessive thickness of the fluorocarbon thin film to be reduced, thereby preventing inhibition of diffusion of reactive ions and radicals, such that the etching target may be etched at an excellent etch rate. Further, excessive deposition of the fluorocarbon thin film on a wall face of the etched structure may be prevented, such that unwanted etching stop may be prevented and thus etching may be performed to a desired depth. Thus, when an etched structure is formed in the etching target using a hole pattern mask according to the plasma etching method of the present disclosure, a high aspect ratio etched structure in which a diameter of the etched structure is equal to a diameter of the hole pattern mask may be formed. However, when a content of the oxygen ($O_2$) gas in the discharge gas is excessively high, the formation of the fluorocarbon thin film serving as a source of the etching target such as silicon oxide is excessively suppressed, thereby inhibiting anisotropic etching of the etching target. In one embodiment, the perfluoropropyl carbinol (PPC) gas, the oxygen ($O_2$) gas, and the argon gas may be provided to the etching chamber such that a ratio of a flow rate of the oxygen ($O_2$) gas and a sum of the flow rate of the perfluoropropyl carbinol (PPC) gas and the flow rate of the argon gas is in a range of about 1:9 (=10:90) to 1:99. For example, the perfluoropropyl carbinol (PPC) gas, the oxygen ($O_2$) gas, and the argon gas may be provided to the etching chamber such that a ratio of a flow rate of the oxygen ($O_2$) gas and a sum of the flow rate of the perfluoropropyl carbinol (PPC) gas and the flow rate of the argon gas is about 7:93.

In one example, in the plasma etching method according to the embodiment of the present disclosure, a bias voltage applied to a substrate supporting the etching target thereon may be in a range of −200V to −1400V. When the bias voltage is lower than −200V, there may be a problem that the etch rate on the etching target is too low. When the bias voltage is higher than −1400V, there may be a problem of increasing only power consumption without further improvement of the etch rate.

Further, in the plasma etching method according to the embodiment of the present disclosure, a source power applied to a plasma source 115 to generate the plasma of the discharge gas may be about 200 W or higher. When the source power is lower than 200 W, there may be a problem that the etch rate on the etching target is remarkably low. In one example, the source power applied to the plasma source 115 to reduce power consumption may be in a range of 200 W inclusive to 1000 W exclusive.

According to the present disclosure, perfluoropropyl carbinol (PPC) has a 16 of GWP, which is remarkably lower than that of the conventional PFC gas. Thus, a mixed gas of perfluoropropyl carbinol (PPC) and argon (Ar) or a mixed gas of perfluoropropyl carbinol (PPC) and argon (Ar) and oxygen ($O_2$) may be provided as a discharge gas to perform the plasma etching process. Thus, compared to the plasma etching process using the existing PFC gas, emission of greenhouse gas may be significantly reduced, and plasma etching may be performed at excellent etching properties.

In particular, according to the plasma etching process of the present disclosure, a deposition rate of the fluorocarbon thin film on the etching target may be reduced and the etch rate on the etching target may be increased, so that the etching target may be etched while appropriately controlling the thickness of the fluorocarbon thin film. When plasma etching is performed on the etching target using a hole pattern mask, a high aspect ratio etched structure in which the diameter of the hole pattern mask and the diameter of the etched structure is substantially equal to each other may be formed. A more detailed description thereof will be described with reference to following examples of the present disclosure.

Hereinafter, more specific examples and experimental examples will be described. However, the following examples are only some implementations of the present disclosure, and the scope of the present disclosure is not limited to the following examples.

EXAMPLE

Plasma etching was performed on a $SiO_2$ thin film formed on a surface of a silicon substrate under various conditions and using a mixed gas of perfluoropropyl carbinol (PPC) and argon as a discharge gas. In this regard, in vaporizing the liquid perfluoropropyl carbinol (PPC) and supplying the vaporized perfluoropropyl carbinol (PPC) to the etching chamber, a canister accommodating therein the liquid perfluoropropyl carbinol (PPC) was heated to 100° C., and a connecting line connecting the canister and the etching chamber to each other was heated to 155° C.

Experimental Example 1: Analysis of Etch Rate Using PPC Plasma Based on Bias Voltage FIG. 2 is a graph measuring a change in an etch rate of a $SiO_2$ thin film based on a bias voltage using a discharge gas composed of PPC in a plasma etching process on the $SiO_2$ thin film under a condition shown in Table 2.

TABLE 2

| Source power (W) | Bias voltage (V) | Discharge Gas | Total Flow Rate (sccm) | Pressure (mTorr) | Substrate Temperature (° C.) |
|---|---|---|---|---|---|
| 250 | −400 to −1200 | PPC | 30 | 10 | 15 |

Figure 2:
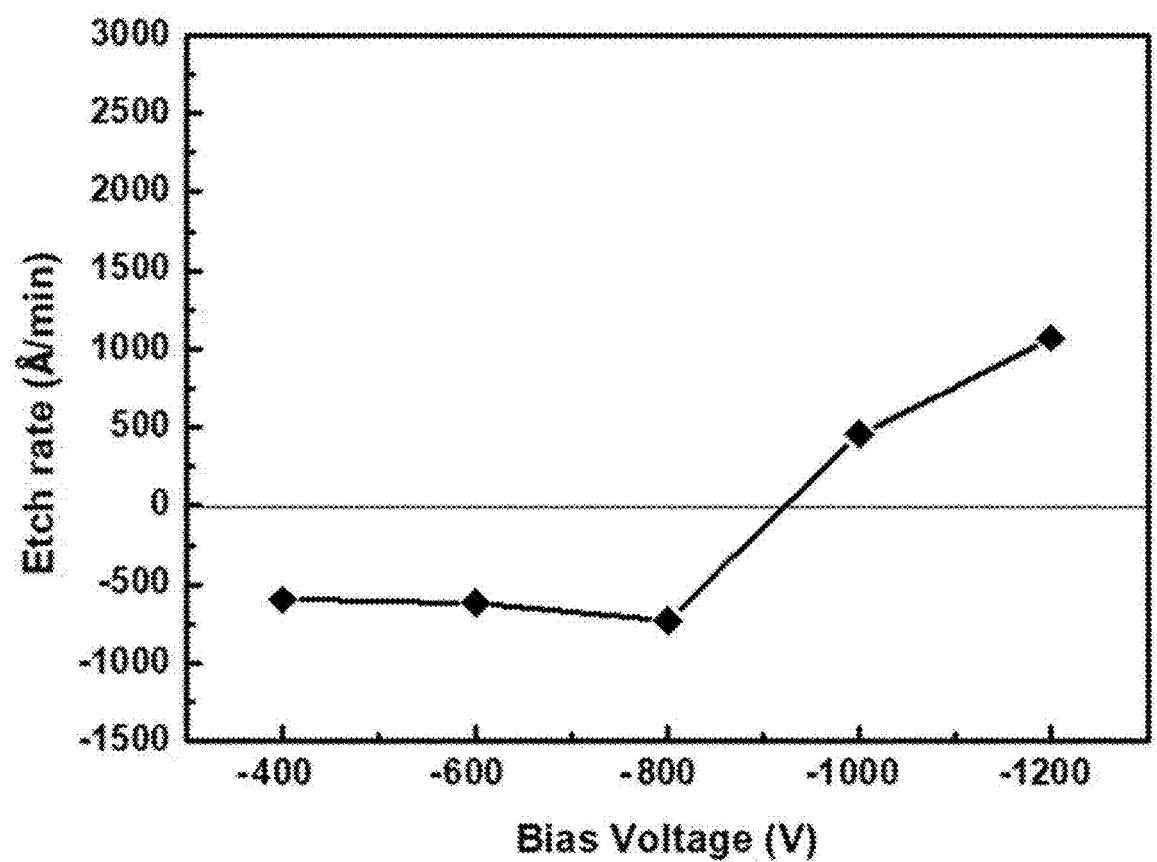
FIG. 2 is a graph measuring a change in an etch rate of a $SiO_2$ thin film based on a bias voltage using a discharge gas composed of PPC in a plasma etching process on the $SiO_2$ thin film under a condition shown in Table 2.

Referring to FIG. 2 together with Table 2, it was identified that in the etching using the PPC gas as the discharge gas, the etch rate was significantly increased when a specific bias voltage was applied thereto. Specifically, it was identified that in the bias voltage range of about −400V to −800V, there was little change in the etch rate as the bias voltage decreased. Further, it was identified that in the bias voltage range of about −1000V to −1200V, the etch rate significantly increased as the bias voltage decreased.

Experimental Example 2: Analysis of Etch Rate Based on Percentage of Argon Gas Flow Rate FIG. 3 is a graph measuring a change in an etch rate of a $SiO_2$ thin film based on a percentage of an argon gas flow rate to a total flow rate of a discharge gas composed of PPC and argon (Ar) in a plasma etching process on the $SiO_2$ thin film under a condition shown in Table 3.

TABLE 3

| Source power (W) | Bias voltage (V) | Discharge Gas (X/Y) | Total Flow Rate (sccm) | Pressure (mTorr) | Substrate Temperature (° C.) |
|---|---|---|---|---|---|
| 250 | −600 | PPC/Ar | 30 | 10 | 15 |

Figure 3:
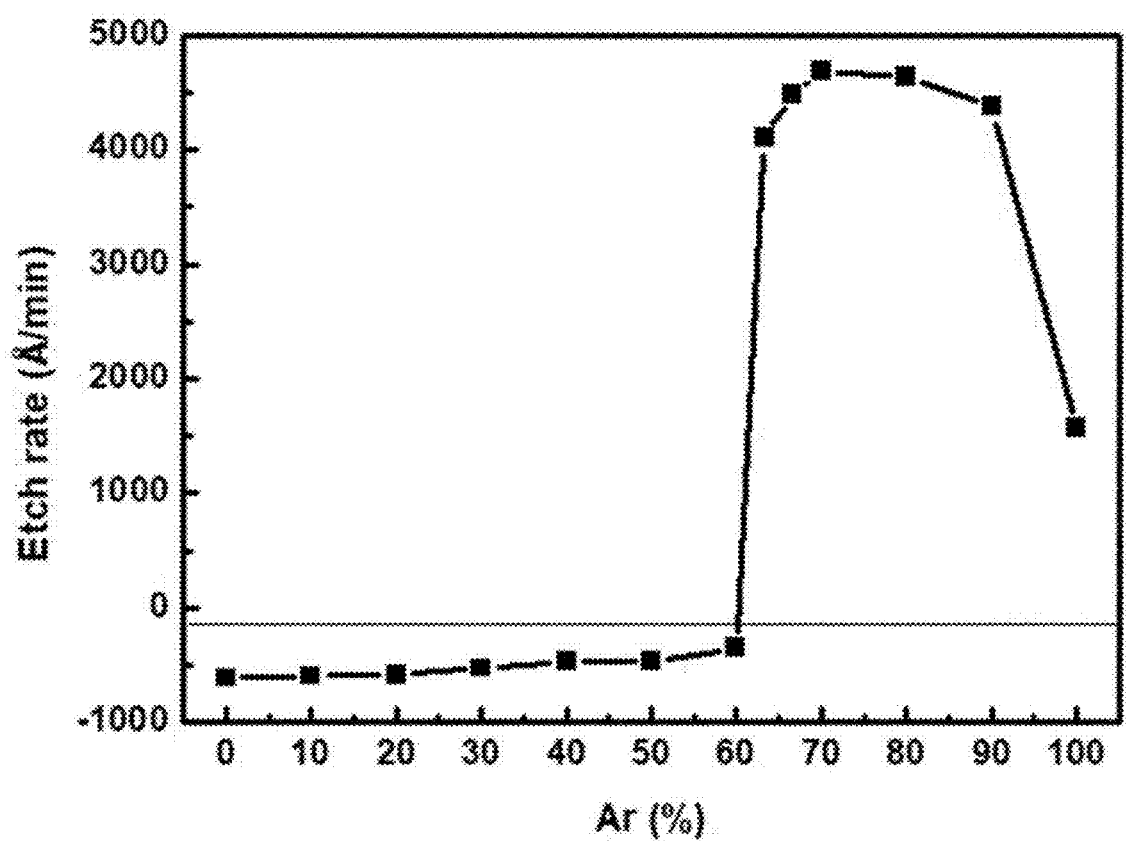
FIG. 3 is a graph measuring a change in an etch rate of a $SiO_2$ thin film based on a percentage of an argon gas flow rate to a total flow rate of a discharge gas composed of PPC and argon (Ar) in a plasma etching process on the $SiO_2$ thin film under a condition shown in Table 3.

Referring to FIG. 3 together with Table 3, it was identified that the etch rate was significantly increased when a mixed gas in which PPC and Ar gas were mixed with each other at a specific flow rate ratio was employed as a discharge gas. Specifically, it is identified that when a percentage of a flow rate of Ar to a total flow rate of the discharge gas exceeds about 60%, the etch rate increases as the percentage of the flow rate of Ar increases. When a percentage of a flow rate of Ar to a total flow rate of the discharge gas is in a range of about 60% to 70%, the etch rate rapidly increases. On the contrary, when the percentage of the Ar flow rate exceeds about 80%, the etch rate decreases as the percentage of the flow rate of Ar increases. The decrease in the etch rate may be expected due to decrease in an amount of etchant capable of etching $SiO_2$. Based on the above results, a percentage of a flow rate of Ar to a total flow rate of the discharge gas is preferably in a range of about 60 to 90%, about 60 to 80%, about 67 to 80%, or about 70 to 80%.

Experimental Example 3: Analysis of Etch Rate Based on Source Power

Figure 4:
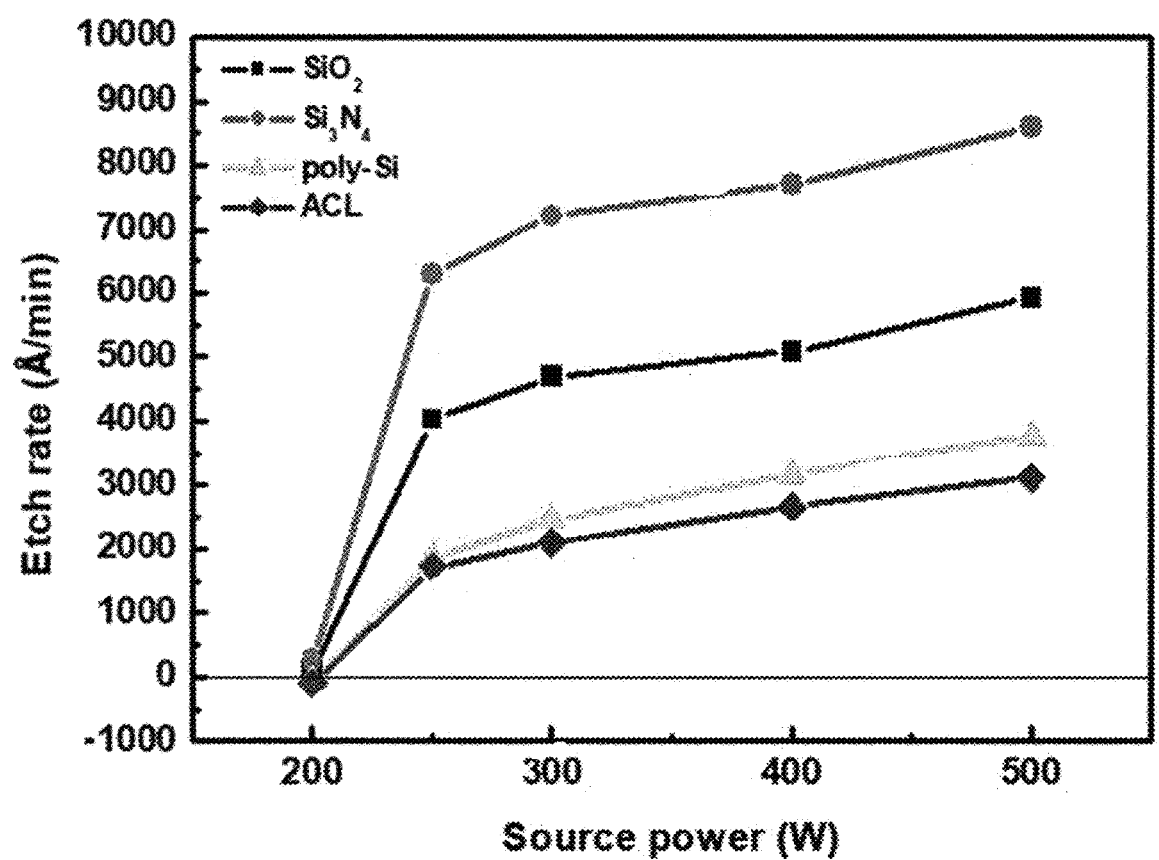
FIG. 4 is a graph measuring a change in an etch rate based on a source power in a plasma etching process on each of various thin films ($Si_3N_4$, $SiO_2$, poly-Si and ACL) under a condition shown in Table 4.

FIG. 4 is a graph measuring a change in an etch rate based on a source power in a plasma etching process on each of various thin films ($Si_3N_4$, $SiO_2$, poly-Si and ACL) under a condition shown in Table 4.

TABLE 4

| Source power (W) | Bias voltage (V) | Discharge Gas | Total Flow Rate (sccm) | Pressure (mTorr) | Substrate Temperature (° C.) |
|---|---|---|---|---|---|
| 250 to 500 | −600 | PPC/Ar | 30 (X/Y = 10/20) | 10 | 15 |

Referring to FIG. 4 together with Table 4, it was identified that as the source power increased, the etch rate increased. Specifically, it was identified that the etch rate of each of all of the $Si_3N_4$, $SiO_2$, poly-Si and ACL thin films increased as the source power increased. Further, it was identified that the etch rate of the $Si_3N_4$ thin film>the etch rate of the $SiO_2$ thin film>the etch rate of the poly-Si thin film>the etch rate of the ACL thin film.

Experimental Example 4: Analysis of Etch Rate Using Etched Structure Based on Bias Voltage FIG. 5 is a graph measuring a change in an etch rate based on a bias voltage in a plasma etching process on each of various thin films ($Si_3N_4$, $SiO_2$, poly-Si and ACL) under a condition shown in Table 5.

TABLE 5

| Source power (W) | Bias voltage (V) | Discharge Gas (X/Y) | Total Flow Rate (sccm) | Pressure (mTorr) | Substrate Temperature (° C.) |
|---|---|---|---|---|---|
| 250 | −400 to −1200 | PPC/Ar | 30 (X/Y = 3/27) | 10 | 15 |

Figure 5:
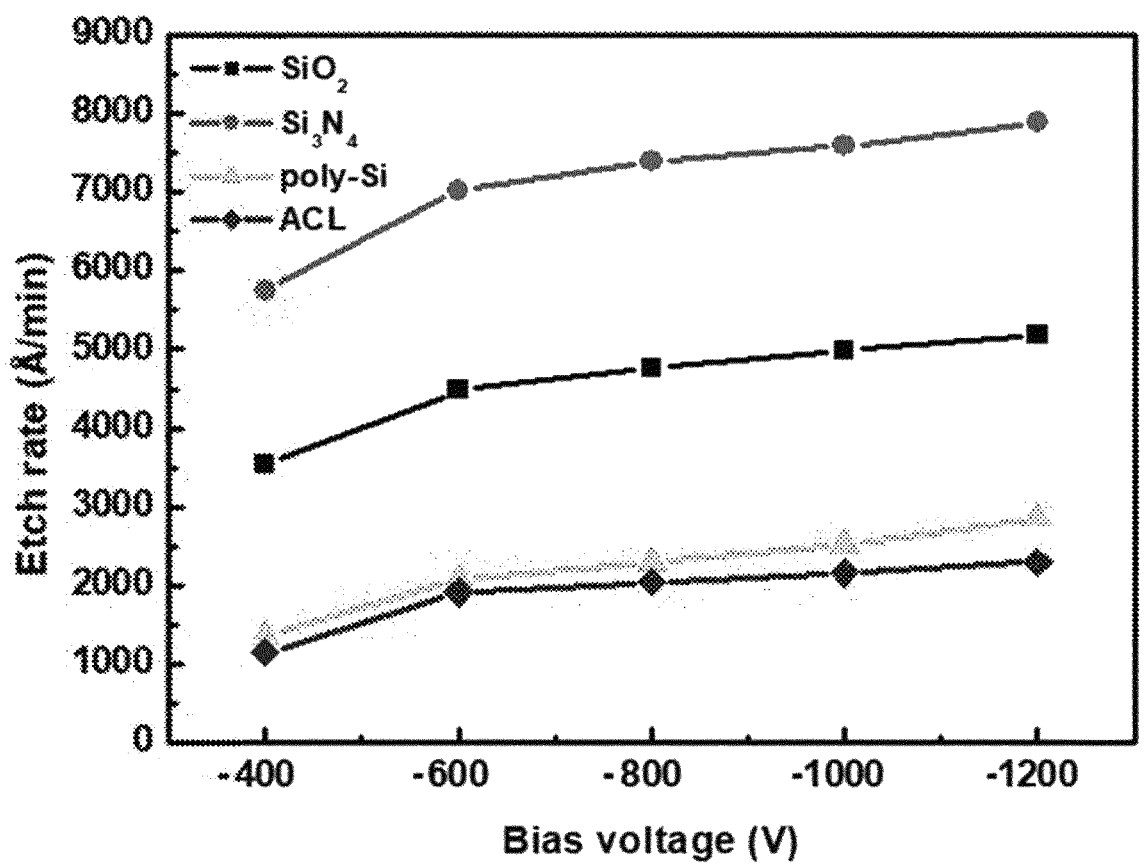
FIG. 5 is a graph measuring a change in an etch rate based on a bias voltage in a plasma etching process on each of various thin films ($Si_3N_4$, $SiO_2$, poly-Si and ACL) under a condition shown in Table 5.

Referring to FIG. 5 together with Table 5, it was identified that as the bias voltage increased, the etch rate increased. Specifically, it was identified that the etch rate of each of all of the $Si_3N_4$, $SiO_2$, poly-Si and ACL thin films increased as the bias voltage increased. Further, it was identified that the etch rate of the $Si_3N_4$ thin film>the etch rate of the $SiO_2$ thin film>the etch rate of the poly-Si thin film>the etch rate of the ACL thin film.

Figure 6:
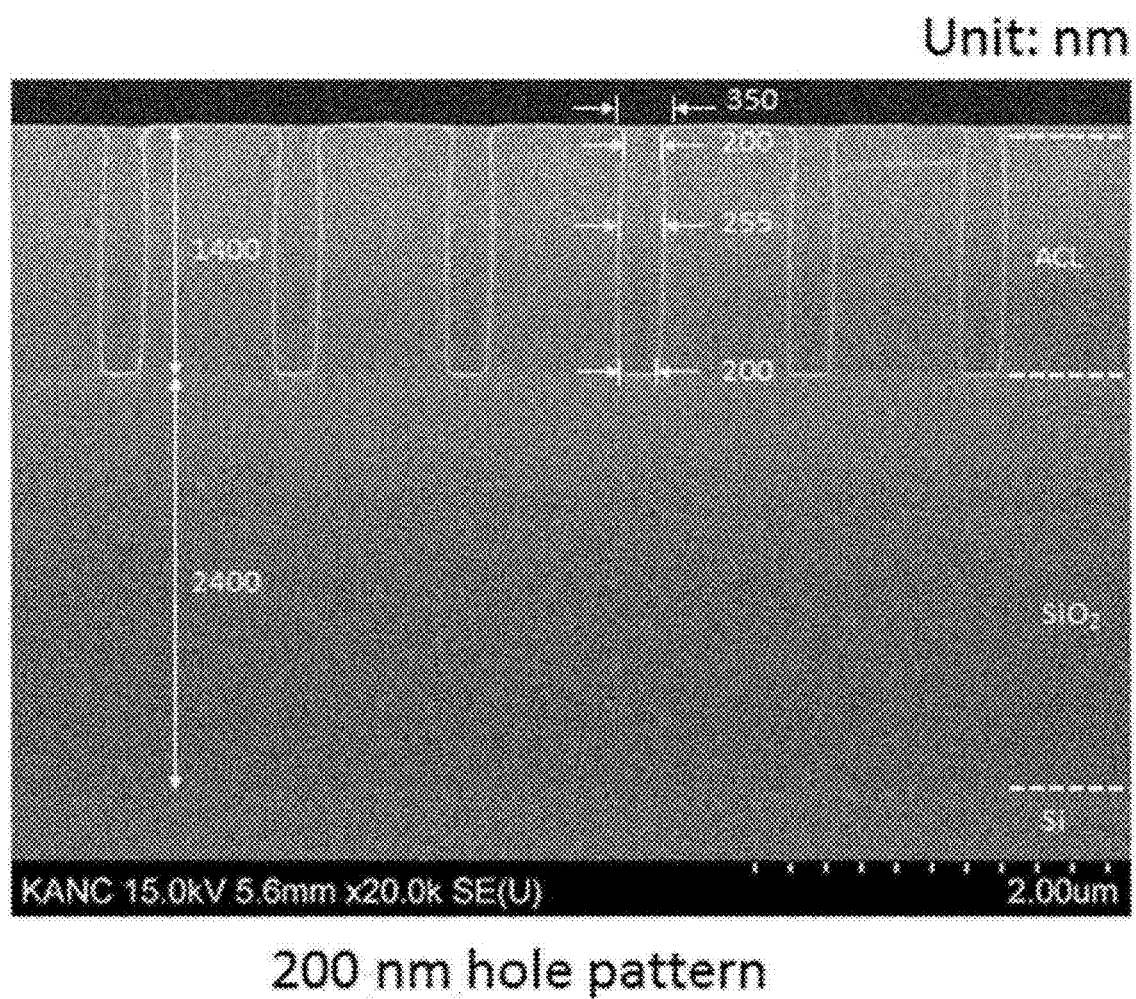
FIG. 6 is an FE-SEM image of each of a silicon substrate, an $SiO_2$ thin film covering a surface thereof, and an etching mask ACL formed thereon before plasma etching. A thickness of the $SiO_2$ thin film is 2400 nm, and a thickness of the etching mask is about 1400 nm. The etching mask includes an ACL layer and a SiON layer formed thereon, and thicknesses thereof are about 1350 nm and 50 nm, respectively. Diameters of hole patterns therein are about 200 nm.
Figure 7:
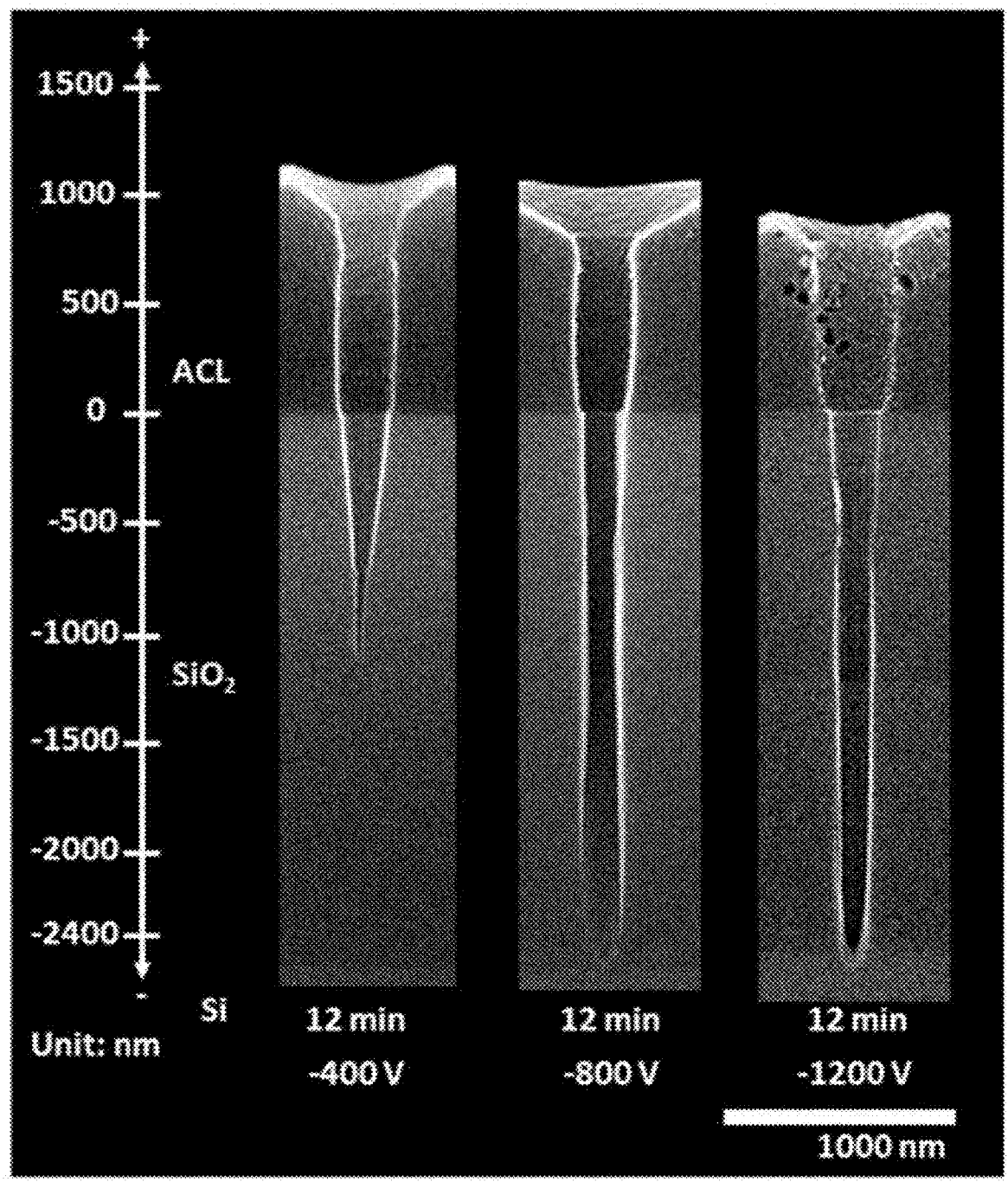
FIG. 7 is a FE-SEM image showing each of etched profiles after plasma etching was performed on the $SiO_2$ thin film of the structure of FIG. 6 for 12 minutes while various bias voltages are applied, under a condition shown in Table 6.

FIG. 6 is an FE-SEM image of each of a silicon substrate, an $SiO_2$ thin film covering a surface thereof, and an etching mask ACL formed thereon before plasma etching. FIG. 7 is a FE-SEM image showing each of etched profiles after plasma etching was performed on the $SiO_2$ thin film of the structure of FIG. 6 for 12 minutes while various bias voltages are applied, under a condition shown in Table 6.

TABLE 6

| Source power (W) | Bias voltage (V) | Discharge Gas | Total Flow Rate (sccm) | Pressure (mTorr) | Substrate Temperature (° C.) | Etching time (min) |
|---|---|---|---|---|---|---|
| 250 | −400, −800, −1200 | PPC/Ar | 30 (X/Y = 10/20) | 10 | 15 | 12 |

Referring to FIG. 7 together with Table 6, it was identified that there was substantial change in the etched depth of the $SiO_2$ thin film based on change in the bias voltage. Specifically, it was identified that when the plasma etching was performed for 12 minutes at each of bias voltages of −400, −800, and −1200 V, following results were obtained. When using −400 V, the etched depth failed to reach about 2400 nm as a depth to a bottom of the $SiO_2$ film and distortion such as narrowing occurred. When using each of −800 V, and −1200 V, the etched depth reached about 2400 nm as a depth to a bottom of the $SiO_2$ film, whereas the etched profile was not a straight shape. Therefore, according to the present disclosure, oxygen ($O_2$) was added to the discharge gas to straighten the etched profile.

Experimental Example 5: Analysis of Etch Rate and Etched Structure Based on Addition of Oxygen ($O_2$)

Figure 8:
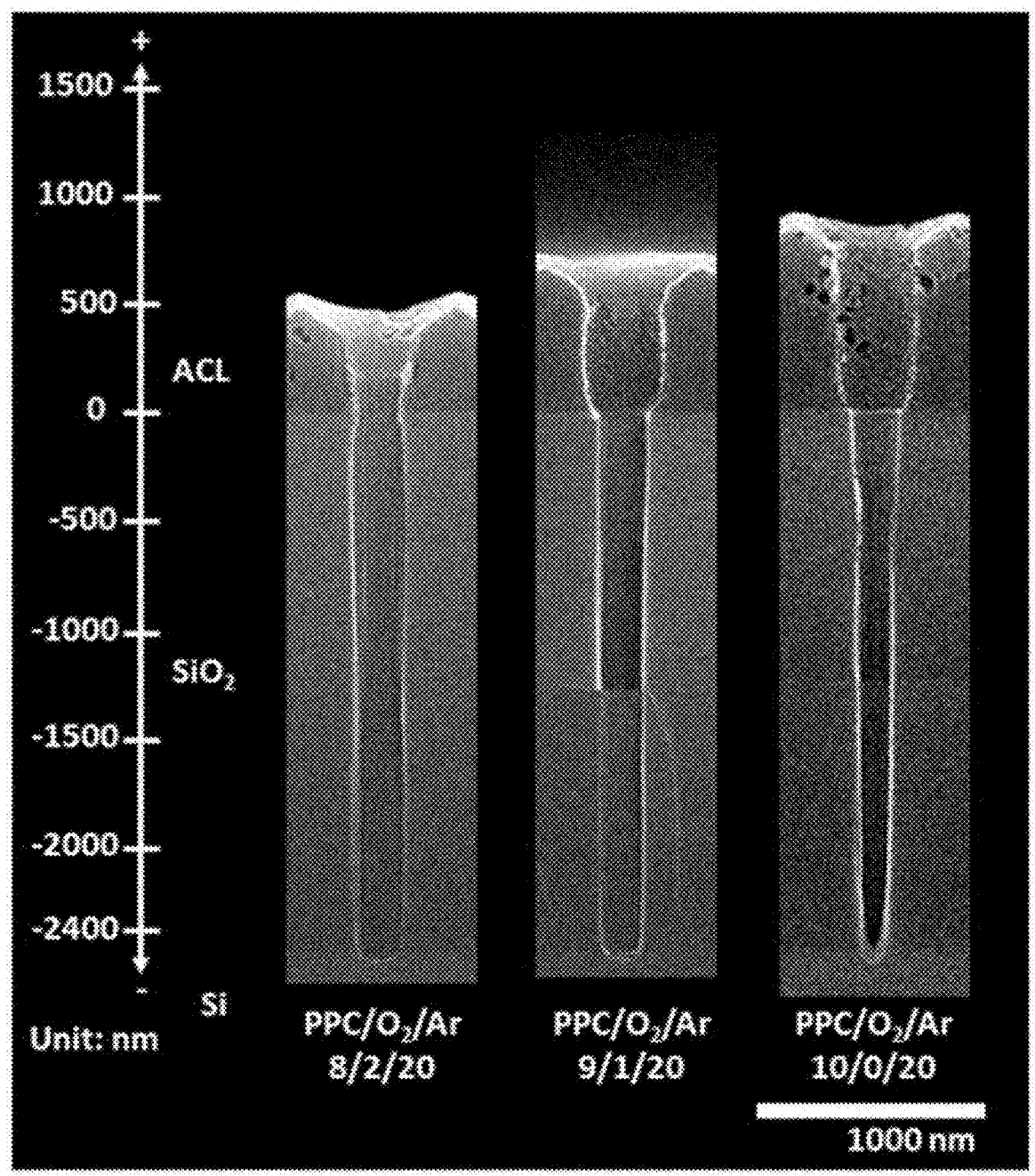
FIG. 8 is a FE-SEM image showing each of etched profiles after plasma etching was performed on a $SiO_2$ thin film for 12 minutes using a discharge gas having each of various oxygen flow rate percentages under a condition shown in Table 7.

FIG. 8 is a FE-SEM image showing each of etched profiles after plasma etching was performed on a $SiO_2$ thin film for 12 minutes using a discharge gas having each of various oxygen flow rate percentages under a condition shown in Table 7.

TABLE 7

| Source power (W) | Bias voltage (V) | Discharge Gas | Total Flow Rate (sccm) | Pressure (mTorr) | Substrate Temperature (° C.) | Etching time (min) |
|---|---|---|---|---|---|---|
| 250 | −1200 | PPC/$O_2$/Ar | 30 (X/Y/Z = 8/2/20 to 10/0/20) | 10 | 15 | 12 |

Referring to FIG. 8 together with Table 7, it was identified that as a percentage of the flow rate of PPC to a total flow rate of the discharge gas decreased and a percentage of the flow rate of oxygen to a total flow rate of the discharge gas increased, the etched depth increased. Specifically, it was identified that the etched depth has reached a bottom (2400 nm) of the $SiO_2$ thin film under a condition that a flow rate of PPC/a flow rate of $O_2$/a flow rate of Ar was 8 sccm/2 sccm/20 sccm when a total flow rate was 30 sccm. Further, it was identified that as a percentage of the flow rate of PPC to a total flow rate of the discharge gas decreased and a percentage of the flow rate of oxygen to a total flow rate of the discharge gas increased, the profile of the etched hole had a very straight shape. As the percentage of the oxygen flow rate to the total flow rate of the discharge gas increased, the ACL mask was etched such that a height thereof was gradually decreasing. However, considering that the etched depth of the $SiO_2$ thin film reaches the bottom thereof, the reduced thickness of the ACL mask may be considered to be a sufficient thickness. Therefore, it is preferable that when the total flow rate of the discharge gas is about 30 sccm, a ratio of the flow rates of PPC, oxygen and argon is 9 sccm:1 sccm:20 sccm (=PPC:oxygen:argon).

Although the present disclosure has been described above with reference to the preferred embodiments of the present disclosure, those skilled in the art may variously modify and change the present disclosure without departing from the spirit and scope of the present disclosure as described in the claims below.

What is claimed is:

1. A plasma etching method comprising:
   a first step of vaporizing liquid perfluoropropyl carbinol (PPC);
   a second step of supplying a discharge gas containing the vaporized perfluoropropyl carbinol (PPC) and argon gas to a plasma chamber in which an etching target is disposed; and
   a third step of discharging the discharge gas to generate plasma and of performing plasma etching on the etching target using the generated plasma.

2. The method of claim 1, wherein in order to vaporize the liquid perfluoropropyl carbinol (PPC) and then supply the vaporized perfluoropropyl carbinol (PPC) to the etching chamber, a first container accommodating the liquid perfluoropropyl carbinol (PPC) therein is heated to a first temperature equal to or higher than a boiling point of the perfluoropropyl carbinol (PPC), and a connecting pipe connecting the first container to the etching chamber is heated to a second temperature higher than the first temperature.

3. The method of claim 1, wherein the vaporized perfluoropropyl carbinol (PPC) and the argon gas are supplied to the etching chamber at a flow rate ratio in a range of 2:3 to 1:9.

4. The method of claim 1, wherein the vaporized perfluoropropyl carbinol (PPC) and the argon gas are supplied to the etching chamber at a flow rate ratio in a range of 2:3 to 1:4.

5. The method of claim 4, wherein the vaporized perfluoropropyl carbinol (PPC) and the argon gas are supplied to the etching chamber at a flow rate ratio in a range of 23:67 to 1:4.

6. The method of claim 5, wherein the vaporized perfluoropropyl carbinol (PPC) and the argon gas are supplied to the etching chamber at a flow rate ratio in a range of 3:7 to 1:4.

7. The method of claim 1, wherein the discharge gas further contains oxygen.

8. The method of claim 7, wherein the perfluoropropyl carbinol (PPC) gas, the argon gas and the oxygen are supplied to the etching chamber so that a ratio of a flow rate of the oxygen and a sum of a flow rate of the perfluoropropyl carbinol (PPC) gas and the flow rate of the argon gas is in a range of 1:3 to 1:99.

9. The method of claim 1, wherein a bias voltage in a range of −200V to −1400V is applied to a substrate supporting the etching target thereon in the etching chamber during the third step.

10. The method of claim 9, wherein a source power in a range of 200 W to 1000 W is applied to a plasma source coupled to the etching chamber to generate plasma of the discharge gas during the third step.

11. The method of claim 1, wherein the etching target is a silicon oxide thin film.

* * * * *